United States Patent
Morisawa

(10) Patent No.: US 9,646,864 B2
(45) Date of Patent: May 9, 2017

(54) SUBSTRATE PROCESSING SYSTEM AND SUBSTRATE TRANSFER CONTROL METHOD

(71) Applicant: TOKYO ELECTRON LIMITED, Tokyo (JP)

(72) Inventor: Daisuke Morisawa, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 848 days.

(21) Appl. No.: 14/055,490

(22) Filed: Oct. 16, 2013

(65) Prior Publication Data
US 2014/0112743 A1    Apr. 24, 2014

(30) Foreign Application Priority Data

Oct. 22, 2012  (JP) ................................. 2012-232691

(51) Int. Cl.
*H01L 21/677* (2006.01)
*H01L 21/67* (2006.01)

(52) U.S. Cl.
CPC .. *H01L 21/67703* (2013.01); *H01L 21/67276* (2013.01)

(58) Field of Classification Search
CPC .................... H01L 21/67703; H01L 21/67276
See application file for complete search history.

(56) References Cited

U.S. PATENT DOCUMENTS

| 6,920,369 | B2* | 7/2005 | Ueno | H01L 21/67167 |
| | | | | 438/5 |
| 7,191,033 | B2* | 3/2007 | Higashi | G05B 19/4189 |
| | | | | 414/935 |
| 8,055,378 | B2* | 11/2011 | Numakura | G05B 19/4184 |
| | | | | 700/109 |
| 8,560,108 | B2* | 10/2013 | Matsuyama | H01L 21/67196 |
| | | | | 414/222.02 |
| 8,571,703 | B2* | 10/2013 | Numakura | H01L 21/67276 |
| | | | | 700/102 |
| 8,588,952 | B2* | 11/2013 | Matsuyama | H01L 21/67173 |
| | | | | 700/112 |
| 2001/0051837 | A1* | 12/2001 | Tateyama | G05B 19/41865 |
| | | | | 700/112 |

(Continued)

FOREIGN PATENT DOCUMENTS

JP    2002-252263 A    9/2002
JP    2006-190894 A    7/2006
(Continued)

*Primary Examiner* — M. N. Von Buhr
(74) *Attorney, Agent, or Firm* — Nath, Goldberg & Meyer; Jerald L. Meyer

(57) ABSTRACT

A substrate processing system includes a plurality of processing chambers configured to perform a predetermined processing with respect to substrates, a transfer device configured to transfer the substrates to the processing chambers in a predetermined order, and a delivery unit configured to deliver the substrates between the delivery unit and the transfer device. The substrate processing system configured to sequentially process the substrates by repeating an operation in a predetermined transfer order. The substrate processing system includes a transfer order setting unit and a transfer control unit configured to switch the first transfer order to the second transfer order.

6 Claims, 12 Drawing Sheets

(56) References Cited

U.S. PATENT DOCUMENTS

| | | | | |
|---|---|---|---|---|
| 2006/0224265 | A1* | 10/2006 | Nakayama | H01L 21/67201 700/108 |
| 2009/0016860 | A1* | 1/2009 | Kaneko | H01L 21/67745 414/222.11 |
| 2011/0208344 | A1* | 8/2011 | Matsuyama | H01L 21/67173 700/112 |

FOREIGN PATENT DOCUMENTS

| | | |
|---|---|---|
| JP | 2009-76504 A | 4/2009 |
| JP | 2011-176117 | 9/2011 |
| JP | 2011-176122 A | 9/2011 |
| KR | 1020020005414 | 1/2002 |
| KR | 1020060105518 | 10/2006 |

* cited by examiner

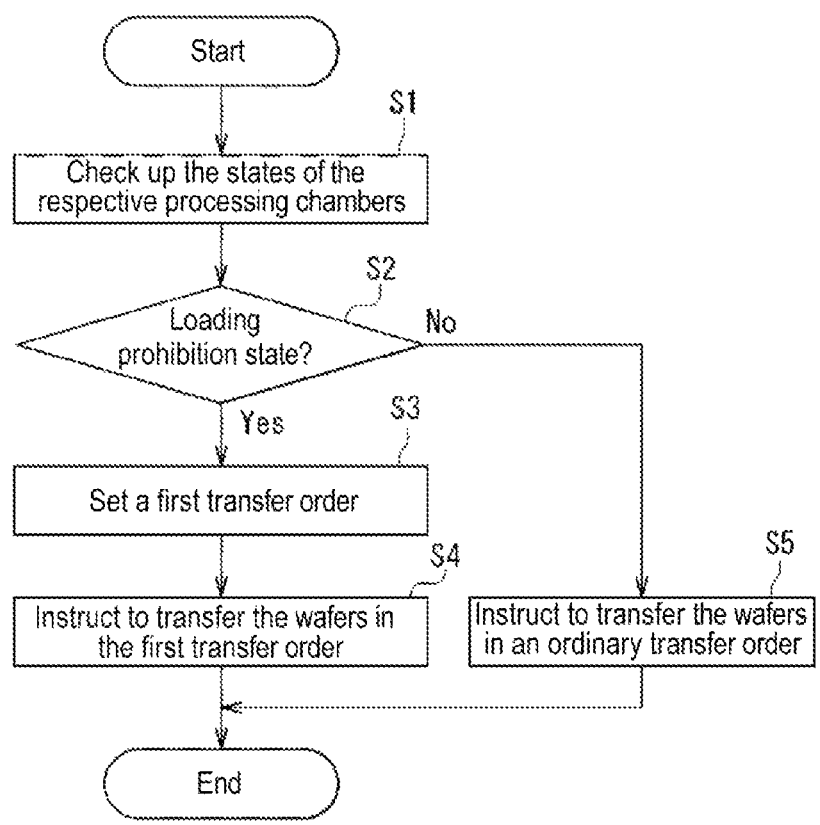

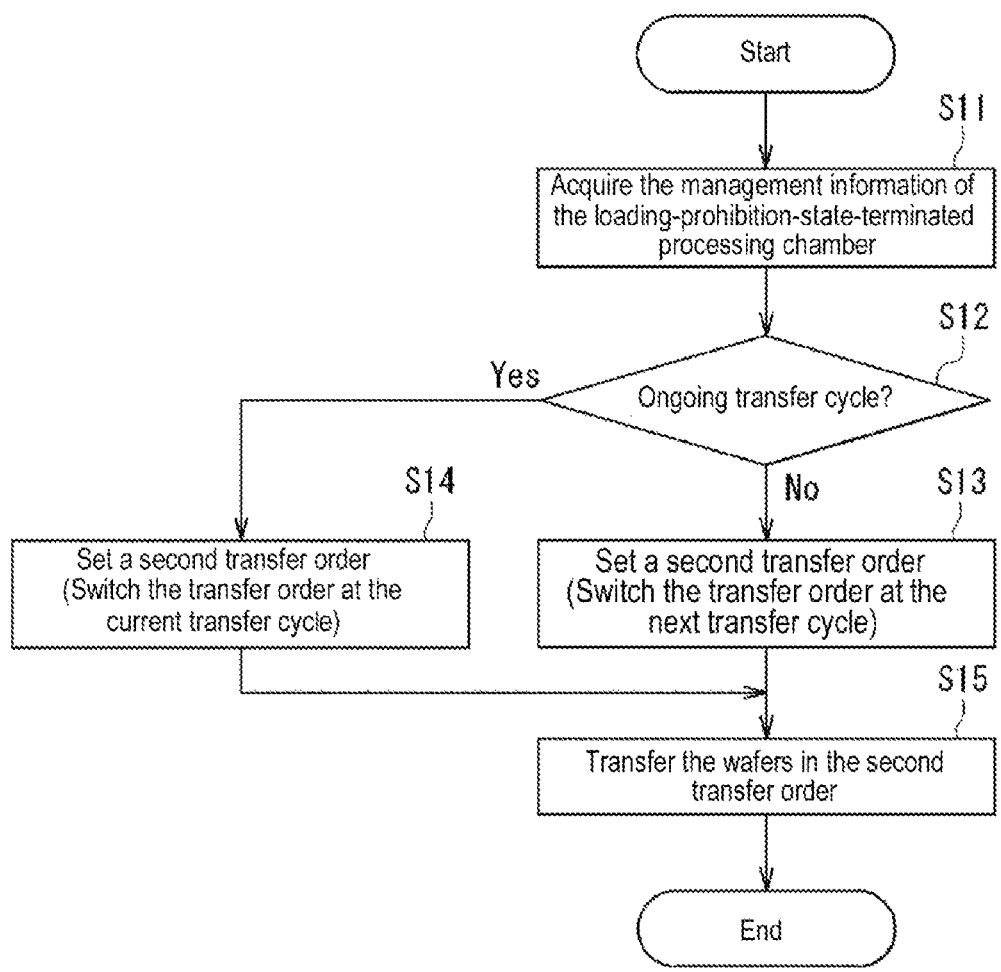

FIG. 7A

| Transfer cycles | | 1 | 2 | 3 | ... | N | N+1 | N+2 | ... |
|---|---|---|---|---|---|---|---|---|---|
| Processing chambers | 1 a | W01 | W04 | W07 | ... | Wn | Wn+4 | Wn+8 | ... |
| | 1 c | W02 | W05 | W08 | ... | Wn+1 | Wn+5 | Wn+9 | ... |
| | 1 d | W03 | W06 | W09 | ... | Wn+2 | Wn+6 | Wn+10 | ... |
| | 1 b | — | — | — | ... | Wn+3 | Wn+7 | Wn+11 | ... |

FIG. 7B

| Transfer cycles | | 1 | 2 | 3 | ... | N | N+1 | N+2 | ... |
|---|---|---|---|---|---|---|---|---|---|
| Processing chambers | 1 a | W01 | W04 | W07 | ... | Wn | Wn+3 | Wn+7 | ... |
| | 1 c | W02 | W05 | W08 | ... | Wn+1 | Wn+4 | Wn+8 | ... |
| | 1 d | W03 | W06 | W09 | ... | Wn+2 | Wn+5 | Wn+9 | ... |
| | 1 b | — | — | — | ... | — | Wn+6 | Wn+10 | ... |

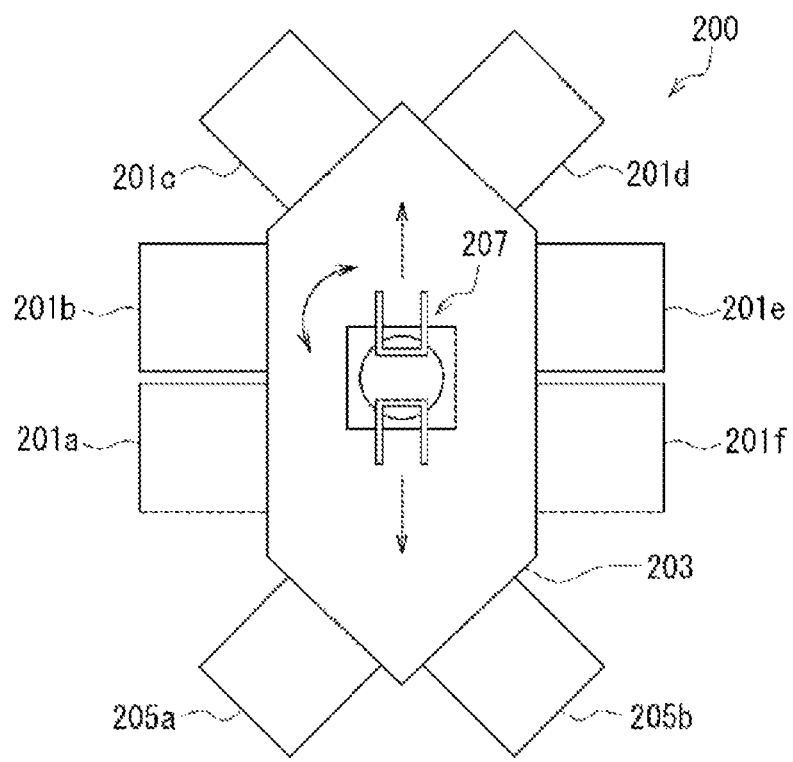

SUBSTRATE PROCESSING SYSTEM AND SUBSTRATE TRANSFER CONTROL METHOD

CROSS-REFERENCE TO RELATED APPLICATION

This application claims the benefit of Japanese Patent Application No. 2012-232691, filed on Oct. 22, 2012, in the Japan Patent Office, the disclosure of which is incorporated herein in its entirety by reference.

TECHNICAL FIELD

The present disclosure relates to a substrate processing system for performing predetermined processing with respect to a substrate such as a semiconductor wafer or the like and a substrate transfer control method for use in the substrate processing system.

BACKGROUND

In a semiconductor device manufacturing process, different kinds of processing such as film-forming and etching are repeatedly performed with respect to a substrate such as a semiconductor wafer or the like. In a semiconductor manufacturing apparatus for performing the processing, a substrate processing system provided with a plurality of processing chambers is used. The substrate processing system includes one or more transfer devices for transferring substrates between the processing chambers within the system and delivering substrates to another substrate processing system.

In the substrate transfer control technology used in the substrate processing system, it has been proposed to improve the transfer efficiency and throughput of a system as a whole by avoiding the likelihood of collision of the substrate loading/unloading timings between processing chambers each having an independent processing time. In this proposal, the cycle time is obtained by summing up the stay time during which one substrate stays within a module and the attendant busy time during which the function of each of the processing chambers is stopped due to the stay of the substrate before and after the stay. The cycle time is set in a substantially equal length with respect to the processing chambers. When gaining access to the respective processing chambers, the processed substrate is unloaded and a subsequent substrate is loaded to replace the processed substrate with the subsequent substrate. The simultaneous replacement of the substrates in the processing chambers is referred to as a pick-and-place transfer.

In the substrate processing system, a transfer control has also been proposed to perform in such a way that, even if a problem occurs in some of processing chambers, a substrate can be transferred to other normal processing chambers. In this proposal, if a problem in a destination processing chamber is detected while a substrate is transferred by a transfer device, the transferring substrate is moved to a standby port. That is, the transfer device is controlled so as to transfer a substrate to a processing chamber with no problem.

Moreover, the transfer control of a serial transfer has been proposed so that a single substrate is sequentially transferred to a plurality of processing chambers. In this proposal, if an unusable processing chamber is generated before a transfer means gains access to a processing chamber existing at the upstream end of a transfer cycle, the transfer cycle is allowed to proceed until the prior substrate can be unloaded from a changed destination processing chamber. If an unusable processing chamber is generated when the transfer means is positioned at the upstream side of the unusable processing chamber in the transfer cycle, the transfer means may stop a transfer operation until the prior substrate can be unloaded from a changed destination processing chamber.

In addition, a transfer route has been proposed to optimize in conjunction with the timing for terminating the prohibition of loading a substrate into a processing chamber. In this proposal, the destinations of substrates accommodated within substrate accommodation ports are decided so that the substrates can be sequentially transferred to the normally-operated processing chambers. In this case, the destination of at least one of the substrates having predetermined destinations may be changed to a loading-prohibition-terminated processing chamber in conjunction with the timing for terminating the prohibition of loading a substrate into the processing chamber which has been subjected to the substrate loading prohibition.

If one of the processing chambers of the substrate processing system kept in a loading prohibition state for whatever reason is terminated from the loading prohibition, a substrate may immediately be loaded into the loading-prohibition-terminated processing chamber. This is advantageous in improving the throughput of the substrate processing in the substrate processing system because the loading-prohibition-terminated processing chamber can be used in an expedited manner. However, even if the substrate processing is carried out under the aforementioned condition in the transfer cycle including the loading-prohibition-terminated processing chamber, the processing efficiency of the substrate processing system as a whole is not improved as one expects. For example, as compared with the processing efficiency of a substrate processing system in which all the processing chambers are normally usable from the beginning, the processing efficiency of a substrate processing system including a the loading-prohibition-terminated processing chamber is definitely reduced even when the number of usable processing chambers remains the same. Study was conducted to investigate the cause for such reduced efficiency. In the pick-and-place transfer, if a new substrate is immediately loaded into the loading-prohibition-terminated processing chamber, it is necessary perform operations to unload substrates from the remaining processing chambers. In this case, the loading of the subsequent substrates is delayed in the remaining processing chambers in which operations to unload substrates are performed. In proportion thereto, the substrate processing is not carried out in the processing chambers or the substrate processing is delayed in certain processing chambers. As a result, the substrate processing time fluctuates and the collision of the substrate loading/unloading timings occurs between the processing chambers. Consequently, during the time when the transfer cycle is repeated in succession, the processing chambers stay empty or the processed substrates are left alone within the processing chambers. This reduces the efficiency of the substrate processing system as a whole.

SUMMARY

Some embodiments of the present disclosure provide a substrate processing system and a substrate transfer control method, which are capable of improving the processing efficiency of the substrate processing system as a whole even when a loading-prohibition-terminated processing chamber is used among a plurality of processing chambers.

According to one embodiment of the present disclosure, there is provided a substrate processing system including a plurality of processing chambers configured to perform a predetermined processing with respect to substrates, a transfer device configured to transfer the substrates to the processing chambers in a predetermined order, and a delivery unit configured to deliver the substrates between the delivery unit and the transfer device, the substrate processing system configured to sequentially process the substrates by repeating an operation in which the substrates are transferred by the transfer device from the delivery unit to the processing chambers in a predetermined transfer order, the substrate processing system further including a transfer order setting unit configured to, when one or more of the processing chambers stays in a substrate loading prohibition state, set a first transfer order with respect to the remaining processing chambers into which the substrates are loadable, and configured to, if the loading prohibition state of one or more of the processing chambers is terminated and brought into a substrate loadable state, set a second transfer order including the first transfer order as it stands, with respect to all the processing chambers into which the substrates are loadable, including the processing chambers whose loading prohibition state is terminated, and a transfer control unit configured to switch the first transfer order to the second transfer order.

According to another embodiment of the present disclosure, there is provided a substrate transfer control method for use in a substrate processing system including a plurality of processing chambers configured to perform a predetermined processing with respect to substrates, a transfer device configured to transfer the substrates to the processing chambers in a predetermined order, and a delivery unit configured to deliver the substrates between the delivery unit and the transfer device, the substrate processing system configured to sequentially process the substrates by repeating an operation in which the substrates are transferred by the transfer device from the delivery unit to the processing chambers in a predetermined transfer order, the method including, when one or more of the processing chambers stays in a substrate loading prohibition state, setting a first transfer order with respect to the remaining processing chambers into which the substrates are loadable, and, if the loading prohibition state of one or more of the processing chambers is terminated and are brought into a substrate loadable state, setting a second transfer order with respect to all the processing chambers into which the substrates are loadable, including the processing chambers whose loading prohibition state is terminated, wherein the second transfer order includes the first transfer order as it stands.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 5 is a flowchart of a reference example explaining a control sequence when the transfer of a substrate is performed in a first transfer order.

FIG. 6 is a flowchart illustrating the sequence of a substrate transfer control method according to a first embodiment of the present disclosure.

FIG. 7A is a table showing the relationship between the management numbers of substrates transferred to the respective processing chambers and the transfer cycles.

FIG. 7B is another table showing the relationship between the management numbers of substrates transferred to the respective processing chambers and the transfer cycles.

FIG. 10A is an explanatory view of a configuration example of a substrate processing system to which the present disclosure is applicable.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

[First Embodiment]

Figure 1:
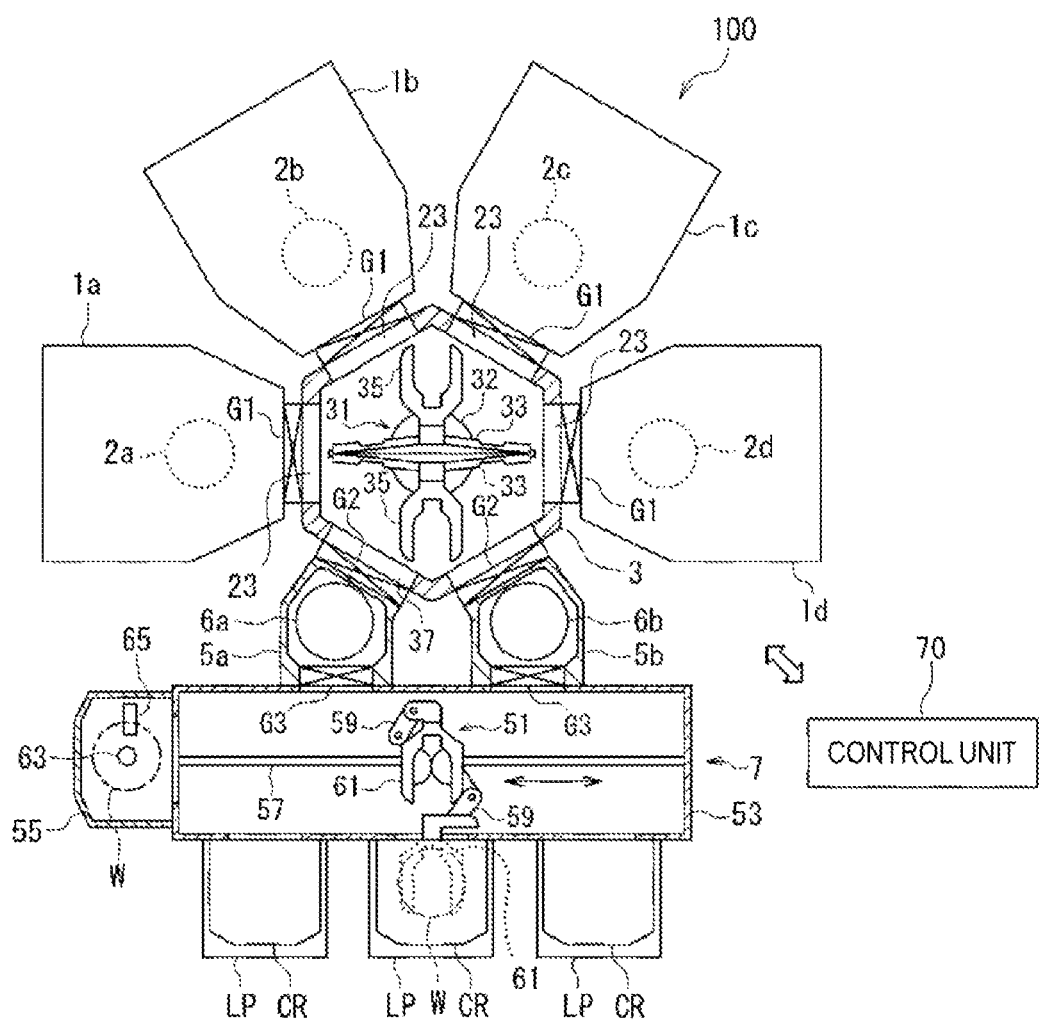
FIG. 1 is a plan view schematically showing a substrate processing system according to one embodiment of the present disclosure.

Certain embodiments of the present disclosure will now be described in detail with reference to the drawings. Referring to FIG. 1, description will be made on a substrate processing system according to one embodiment of the present disclosure. FIG. 1 is a schematic configuration view showing a substrate processing system 100 configured to perform different kinds of processing such as film forming, etching, ashing, reforming, oxidizing and diffusing with respect to, e.g., a semiconductor wafer (hereinafter just referred to as "wafer") W as a substrate.

The substrate processing system 100 is formed of a cluster tool having a multi-chamber structure. The substrate processing system 100 includes, as major components thereof, four processing chambers 1a, 1b, 1c and 1d for performing different kinds of processing with respect to the wafer W, a vacuum-side transfer chamber 3 connected to the processing chambers 1a, 1b, 1c and 1d through respective gate valves G1, two load-lock chambers 5a and 5b connected to the vacuum-side transfer chamber 3 through respective gate valves G2, and a loader unit 7 connected to the load-lock chambers 5a and 5b through respective gate valves G3.

The four processing chambers 1a, 1b, 1c and 1d are processing apparatuses for performing different kinds of processing such as CVD processing, etching, ashing, reforming, oxidizing and diffusing with respect to the wafer W. The processing chambers 1a, 1b, 1c and 1d may be configured to perform the same kind of processing with respect to the wafer W. Alternatively, the processing chambers 1a, 1b, 1c and 1d may be grouped into a plurality of sets, each of which performs different kinds of processing. Within the respective processing chambers 1a, 1b, 1c and 1d, processing stages 2a, 2b, 2c and 2d may be arranged as "first substrate tables," each supporting the wafer W.

The processing chamber 1b for performing, e.g., CVD, is hermetically sealed. The processing stage 2b for horizontally supporting the wafer W is installed within the processing chamber 1b. While not shown in the drawings, a plurality of support pins for supporting the wafer W and moving the wafer W up and down is installed in the processing stage 2b so as to extend and retract the wafer W with respect to the placing surface of the processing stage 2b. The support pins are moved up and down by an arbitrary elevator mechanism. In the raised position, the support pins are configured to transfer the wafer W between the support pins and the vacuum-side transfer device 31 (to be described later).

A loading/unloading port 23 is formed on the sidewall of the processing chamber 1b, and configured to load and unload the wafer W to and from the vacuum-side transfer chamber 3. By opening and closing the gate valve G1, the wafer W is loaded and unloaded through the loading/unloading port 23.

A vacuum-side transfer device 31 is installed in the vacuum-side transfer chamber 3 capable of being vacuum-drawn, as a first substrate transfer device for performing a delivery of the wafer W to the processing chambers 1a, 1b, 1c and 1d and the load-lock chambers 5a and 5b. The vacuum-side transfer device 31 includes a base portion 32 and a pair of transfer arm portions 33. The pair of transfer arm portions 33 are connected to the base portion 32 and arranged so as to face each other. Further, each of the pair of transfer arm portions 33 is configured to be bent, stretched and swung about the same rotation axis. At the tip of each of the pair of transfer arm portions 33, forks 35 and 35 are installed as holding members for supporting and holding the wafers W. In a state that the wafers W are placed on the forks 35 and 35, the vacuum-side transfer device 31 transfers the wafers W between the processing chambers 1a, 1b, 1c and 1d or between the processing chambers 1a, 1b, 1c and 1d and the load-lock chambers 5a and 5b. In the lateral portion of the vacuum-side transfer chamber 3, loading/unloading ports 37 are formed in the positions corresponding to the processing chambers 1a, 1b, 1c and 1d and the load-lock chambers 5a and 5b existing around the vacuum-side transfer chamber 3. In a state that the gate valves G1 and G2 are kept open, the wafers W are loaded and unloaded through the respective loading/unloading ports 37.

The load-lock chambers 5a and 5b are vacuum preparatory chambers used when the wafers W are transferred between the vacuum-side transfer chamber 3 and the atmosphere-side transfer chamber 53 (to be described later). Accordingly, the load-lock chambers 5a and 5b are configured to switch a vacuum state and an atmosphere-open state. Within the load-lock chambers 5a and 5b, standby stages 6a and 6b are installed for supporting the wafers W. The wafers W are transferred between the vacuum-side transfer chamber 3 and the atmosphere-side transfer chamber 53 by way of the standby stages 6a and 6b. In the present embodiment, the standby stage 6a and the standby stage 6b are used as "delivery units" for transferring the wafers W between the vacuum-side transfer device 31 and another transfer device (the atmosphere-side transfer device 51).

The loader unit 7 includes a transfer chamber 53 opened to the atmospheric pressure, three load ports LP arranged adjacent to the transfer chamber 53, and an orienter 55 as a position measuring device for measuring the position of the wafer W. An atmosphere-side transfer device 51 is installed as a second substrate transfer device for transferring the wafer W in the transfer chamber 53.

The transfer chamber 53 opened to the atmospheric pressure includes a circulation arrangement (not shown) for circulating, e.g., a nitrogen gas or a clean air, and has a rectangular shape when seen in a plan view. A guide rail 57 is installed to extend along the longitudinal direction of the transfer chamber 53. The atmosphere-side transfer device 51 is movably supported on the guide rail 57. In other words, the atmosphere-side transfer device 51 can be moved by a drive mechanism not shown along the guide rail 57 in the direction indicated by an arrow in FIG. 1. The atmosphere-side transfer device 51 includes a pair of transfer arm portions 59 arranged in two upper and lower stages. Each of the pair of transfer arm portions 59 can be bent, stretched and swung. At the tip of each of the pair of transfer arm portions 59, forks 61 are installed as holding members for supporting and holding the wafers W. In a state that the wafers W are placed on the forks 61, the atmosphere-side transfer device 51 transfers the wafers W between the wafer cassettes CR of the load ports LP, the load-lock chambers 5a and 5b and the orienter 55.

The load ports LP is configured to support the wafer cassettes CR. Each of the wafer cassettes CR is configured to accommodate a plurality of wafers W placed in multiple stages at an equal interval.

The orienter 55 includes a rotary plate 63 rotated by a drive motor (not shown) and an optical sensor 65 installed in a position corresponding the outer periphery of the rotary plate 63 and configured to detect the peripheral edge portion of the wafer W. While rotating the rotary plate 63 on which the wafer W is placed, the optical sensor 65 irradiates band-like laser light from a light source unit (not shown) toward the peripheral edge portion of the wafer W. A detection unit (not shown) detects the laser light partially cut off by the wafer W. Based on the laser light detection result, the optical sensor 65 calculates the off-centered amount and the off-centered direction of the wafer W with respect to the center of the rotary plate 63. Moreover, the optical sensor 65 recognizes a cutout portion (a notch or an orientation flat) formed in the rotating wafer W, thereby detecting the azimuth of the wafer W and changing the orientation of the wafer W to a predetermined direction. The atmosphere-side transfer device 51 receives the wafer W with the fork 61 on the rotary plate 63 in such a way as to correct the off-centered amount and the off-centered direction of the wafer W calculated by the optical sensor 65.

Figure 2:
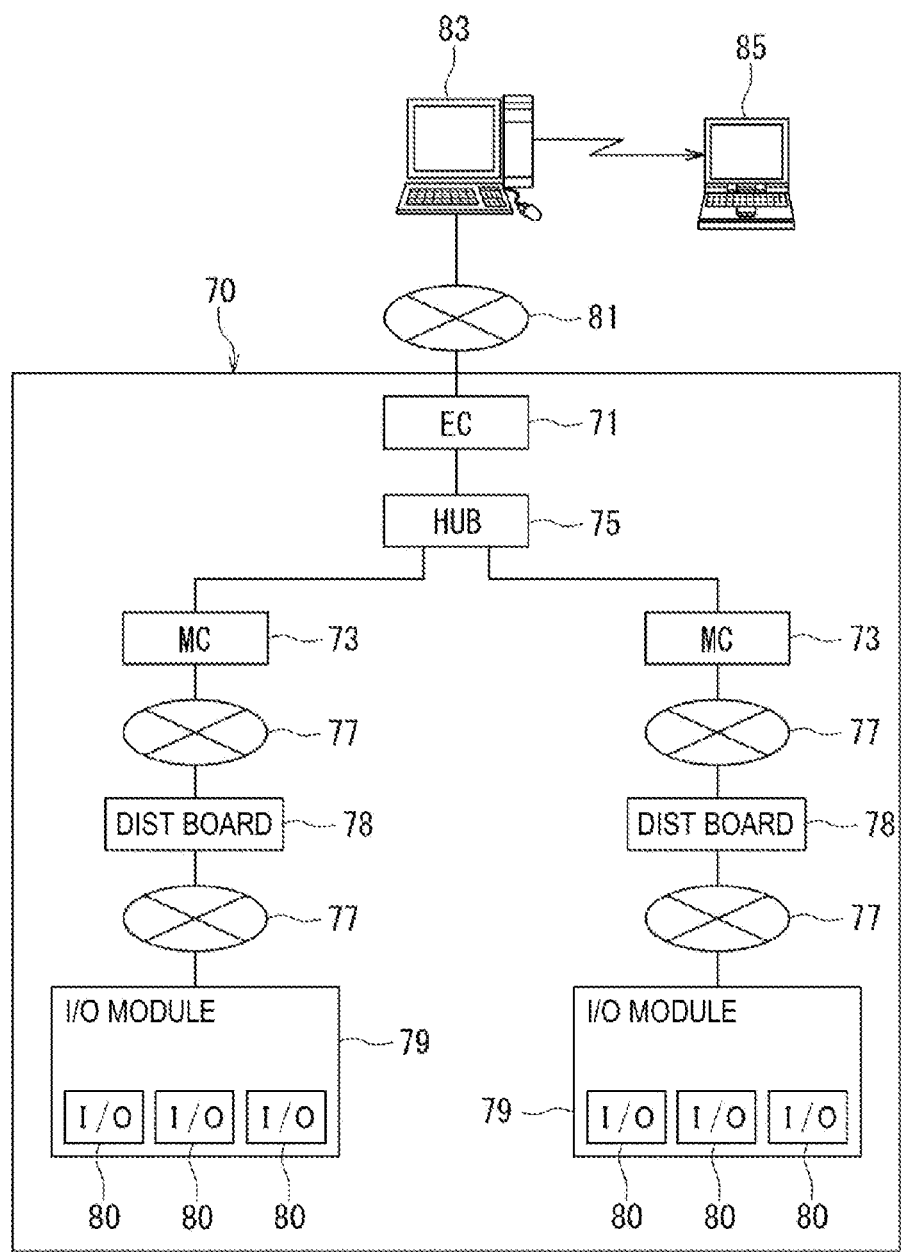
FIG. 2 is a block diagram showing the hardware configuration of a control unit of the substrate processing system according to one embodiment of the present disclosure.

The respective component parts of the substrate processing system 100 are connected to a control unit 70 and are controlled by the control unit 70. Referring to FIG. 2, description will be made on the control unit 70 of the substrate processing system 100 according to the present embodiment. FIG. 2 is a block diagram showing the hardware configuration of the control unit 70 of the substrate processing system 100. As shown in FIG. 2, the control unit 70 of the substrate processing system 100 includes an equipment controller (hereinafter sometimes referred to as "EC") 71, a plurality of (two, in FIG. 2) module controllers (hereinafter sometimes referred to as "MCs") 73, and a switching hub 75 for interconnecting the EC 71 and the MCs 73.

The EC 71 is a main control unit (master control unit) that governs the MCs 73 and controls the overall operation of the substrate processing system 100. The MCs 73 are auxiliary control units (salve control units) that, under the control of the EC 71, control the operations of the processing chambers 1a, 1b, 1c and 1d, the transfer chamber 3 including the vacuum-side transfer device 31 and the transfer chamber 53 including the atmosphere-side transfer device 51. In response to a control signal supplied from the EC 71, the switching hub 75 switches the MCs 73 to be connected to the EC 71.

Based on a control program for realizing different kinds of processing performed with respect to the wafer W in the substrate processing system 100 and a recipe for recording processing condition data and so forth, the EC 71 sends a control signal to each of the MCs 73, thereby controlling the overall operation of the substrate processing system 100.

The control unit 70 further includes sub networks 77, DIST (distribution) boards 78 and input/output (hereinafter referred to as I/O) modules 79. The respective MCs 73 are connected to the I/O modules 79 through the sub networks 77 and the DIST boards 78.

Each of the I/O modules 79 includes a plurality of I/O portions 80. The I/O portions 80 are connected to the respective end devices of the substrate processing system 100. While not shown in the drawings, I/O boards for controlling the input and output of a digital signal, an analog signal and a serial signal are installed in the I/O portions 80. Control signals for the respective end devices are outputted from the I/O portions 80. Output signals outputted from the respective end devices are inputted to the I/O portions 80. Examples of the end devices connected to the I/O portions 80 include the MFCs (mass flow controllers) for controlling the flow rates of different kinds of gases such as a source gas and so forth supplied into the processing chambers 1a, 1b, 1c and 1d, the pressure gauge, the APC (Automatic Pressure Control) valve, the vacuum-side transfer device 31, the atmosphere-side transfer device 51 and the respective gate valves G1, G2 and G3.

The EC 71 is connected through a LAN (Local Area Network) 81 to a computer 83 as a MES (Manufacturing Execution System) for managing the overall manufacturing process of a factory in which the substrate processing system 100 is installed. In cooperation with the control unit 70 of the substrate processing system 100, the computer 83 feeds back the real-time information on the process of the factory to a basic business system. The computer 83 makes judgment on the process in view of the overall load of the factory. The computer 83 may be connected to an information processing device, e.g., a computer 85.

Figure 3:
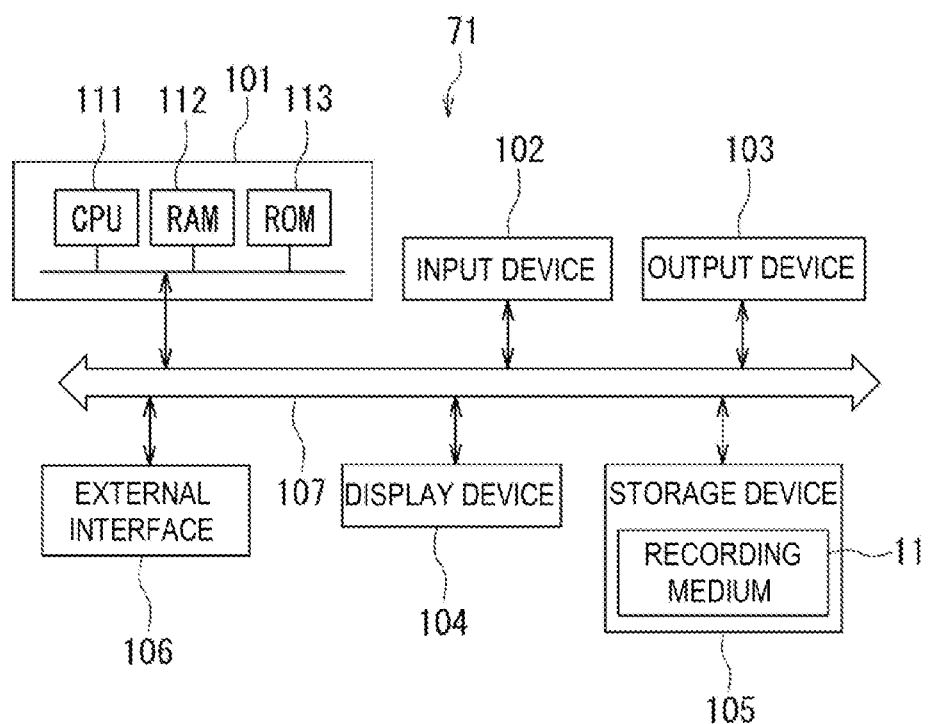
FIG. 3 is a block diagram showing the hardware configuration of an equipment controller shown in FIG. 2.

Referring next to FIG. 3, description will be made on one example of the hardware configuration of the EC 71. The EC 71 includes a main control unit 101, an input device 102 such as a keyboard or a mouse, an output device 103 such as a printer or the like, a display device 104, a storage device 105, an external interface 106 and a bus 107 for interconnecting the main control unit 101, the input device 102, the output device 103, the display device 104, the storage device 105 and the external interface 106. The main control unit 101 includes a CPU (Central Processing Unit) 111, a RAM (Random Access Memory) 112 and a ROM (Read Only Memory) 113. The storage device 105 may be, e.g., a hard disk device or an optical disk device, although the type of the storage device 105 does not matter as long as it can store information. The storage device 105 is configured to record information on a computer-readable recording medium 115 and to read information from the recording medium 115. The recording medium 115 may be, e.g., a hard disk, an optical disk or a flash memory, although the type of the recording medium 115 does not matter as long as it can store information. The recording medium 115 may be a recording medium that stores a recipe of the substrate transfer control method according to the present embodiment.

In the EC 71, the CPU 111 executes the program stored in the ROM 113 or the storage device 105 using the RAM 112 as a work area, thereby performing the substrate transfer control method according to the present embodiment. The hardware configurations of the computers 83 and 85 shown in FIG. 2 may be the same as, e.g., the configuration shown in FIG. 3. The hardware configuration of the MCs 73 shown in FIG. 2 may be the same as, e.g., the configuration shown in FIG. 3 or may be a configuration obtained by excluding unnecessary components from the configuration shown in FIG. 3.

Figure 4:
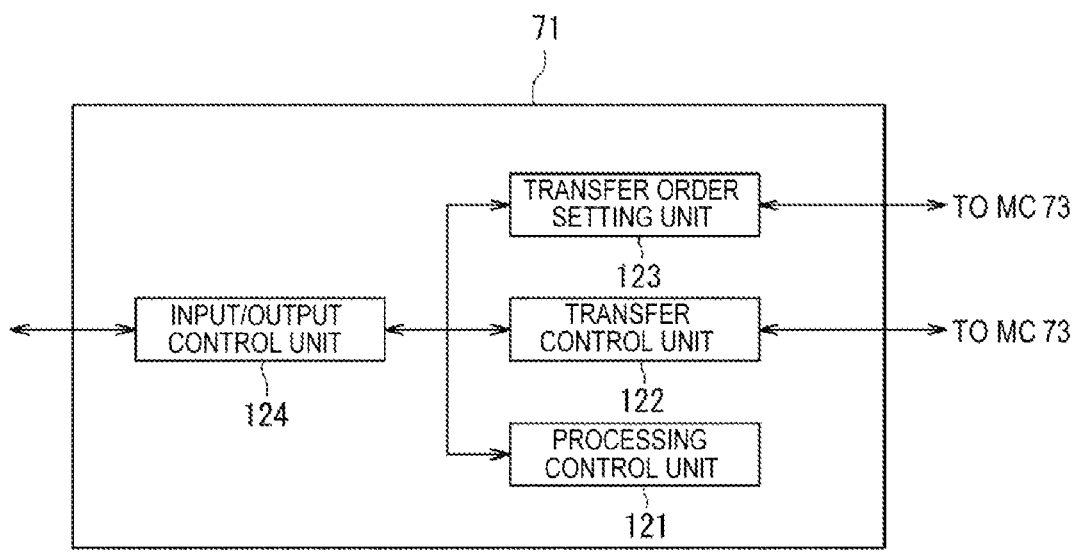
FIG. 4 is a functional block diagram showing the functional configuration of the equipment controller shown in FIG. 2.

Referring to FIG. 4, description will be made on the functional configuration of the EC 71. FIG. 4 is a functional block diagram showing the functional configuration of the 71. In the following description, the reference numbers of FIG. 3 will be referred to because the hardware configuration of the EC 71 is the same as the configuration shown in FIG. 3. As shown in FIG. 4, the EC 71 includes a processing control unit 121, a transfer control unit 122, a transfer order setting unit 123 and an input/output control unit 124, all of which are realized by the CPU 111 that executes the program stored in the ROM 113 or the storage device 105 using the RAM 112 as a work area.

Based on the recipe or the parameters previously stored in the storage device 105, the processing control unit 121 sends control signals to the respective MCs 73, thereby controlling the respective processing chambers 1a, 1b, 1c and 1d of the substrate processing system 100.

Pursuant to the recipe or the parameters previously stored in the storage device 105, the transfer control unit 122 sends control signals to the MC 73 of the transfer chamber 3 including the vacuum-side transfer device 31 and the MC 73 of the transfer chamber 53 including the atmosphere-side transfer device 51, thereby controlling the MCs 73 so that the wafers W can be transferred, e.g., between the load-lock chambers 5a and 5b and the respective processing chambers 1a, 1b, 1c and 1d or between the wafer cassettes CR of the load ports LP, the load-lock chambers 5a and 5b and the orienter 55. In addition, the transfer control unit 122 performs switching from a first transfer order to a second transfer order as will be described later.

Based on the information of the respective processing chambers 1a, 1b, 1c and 1d sent from the MCs 73 and the recipe or the parameters previously stored in the storage device 105, the transfer order setting unit 123 sets the order of loading the wafers W into the respective processing chambers 1a, 1b, 1c and 1d. More specifically, the transfer order setting unit 123 sets the first transfer order and the second transfer order as will be described later.

The input/output control unit 124 is configured to control the input from the input device 102, the output to the output device 103, the display on the display device 104, and the input and output of data received through the external interface 106.

In the substrate processing system 100 configured as above, the specified processing decided by the recipe is performed with respect to the wafer W under the control of the control unit 70. First, one wafer W is taken out from one of the wafer cassettes CR and is aligned by the orienter 55. Thereafter, the wafer W is loaded into one of the load-lock chambers 5a and 5b and is put on one of the standby stages 6a and 6b. The wafer W existing in the load-lock chamber 5a or 5b is transferred to one of the processing chambers 1a, 1b, 1c and 1d using the vacuum-side transfer device 31 and is put on one of the processing stages 2a, 2b, 2c and 2d. For example, within the processing chamber 1a, the wafer W placed on the processing stage 2a is heated under a vacuum condition by a heater (not shown), while source gas is supplied toward the wafer W. As a result, a specified thin film is formed on the surface of the wafer W by a CVD method. After the formation of the thin film, the wafer W is returned to one of the wafer cassettes CR in the reverse order. Thus, the processing of one wafer W is finished. In this case, according to the pick-and-place transfer, the vacuum-side transfer device 31 receives the film-formed wafer W within, e.g., the processing chamber 1a, and loads a new wafer W into the processing chamber 1a.

[Substrate Transfer Control Method according to a First Embodiment]

Next, description will be made on a substrate transfer control method according to a first embodiment of the present disclosure, which is carried out by the substrate processing system 100 configured as above. FIG. 5 is a flowchart of an example explaining the sequence of transferring the wafer W in a first transfer order, which forms the premise of the substrate transfer control method according to the present embodiment. FIG. 6 is a flowchart schematically explaining the sequence of the substrate transfer control method according to the present embodiment. According to the present embodiment, in a transfer method, the same kind of processing (e.g., film forming) is parallel-performed within the processing chambers 1a, 1b, 1c and 1d of the substrate processing system 100 [namely, a method of transferring each of the substrates to any one of the processing chambers 1a, 1b, 1c and 1d (an OR method)].

Referring to FIG. 5, in step S1, the EC 71 first checks the states of the respective processing chambers 1a, 1b, 1c and 1d based on the information supplied from the respective MCs 73. The term "the states of the respective processing chambers 1a, 1b, 1c and 1d" used herein means whether the respective processing chambers 1a, 1b, 1c and 1d are ready for the processing of the wafers W. For example, if an error is generated for whatever reason or if a maintenance work, a conditioning process, a diagnosing (leakage measuring or device adjusting) process, or a use in an advance lot is underway, the respective processing chambers 1a, 1b, 1c and 1d are not ready for the processing of the wafers W.

Then, in step S2, based on the checkup result obtained in step S1, the EC 71 determines whether one of the processing chambers 1a, 1b, 1c and 1d is in a wafer-loading-prohibition state. If it is confirmed in step S1 that there is a processing chamber not ready for the processing of the wafers W, the processing chamber goes into a loading prohibition state. In the following description, it is assumed that the processing chamber 1b is kept in the loading prohibition state.

If it is determined in step S2 that there exists a loading-prohibited processing chamber (the processing chamber 1b) (if Yes in step S2), the EC 71 sets a first transfer order with respect to the processing chambers 1a, 1c and 1d excluding the processing chamber 1b in step S3. More specifically, the transfer order setting unit 123 of the EC 71 sets the order of loading the wafers W into the processing chambers 1a, 1c and 1d, based on the information of the processing chambers 1a, 1c and 1d sent from the MCs 73 and the recipe or the parameters stored in the storage device 105. In the present embodiment, the first transfer order is set such that the wafers W are loaded in the order of the processing chamber 1a, the processing chamber 1c and the processing chamber 1d.

Once the first transfer order is decided in step S3, a control signal is transmitted in step S4 from the EC 71 to the MC 73 of the transfer chamber 3 including the vacuum-side transfer device 31, thereby instructing the vacuum-side transfer device 31 to transfer the wafers W in the first transfer order.

On the other hand, if it is determined in step S2 that there exists no loading-prohibited processing chamber (if No in step S2), the EC 71 instructs the MC 73 of the transfer chamber 3 including the vacuum-side transfer device 31, in step S5, to transfer the wafers W in an ordinary transfer order previously decided by the recipe. In the present embodiment, the ordinary transfer order is set such that the wafers W are loaded in the order of the processing chamber 1a, the processing chamber 1b, the processing chamber 1c and the processing chamber 1d.

As set forth above, if the processing chamber 1b is in the loading prohibition state, the substrate processing system 100 performs a specified processing in the first transfer order pursuant to the sequence of steps S1 to S4. In other words, the vacuum-side transfer device 31 loads the wafers W in the order of the processing chamber 1a, the processing chamber 1c and the processing chamber 1d. The specified processing is performed in the respective processing chambers 1a, 1c and 1d. If the processing is finished, the processed wafers W are replaced by other wafers W in the same order. The same kind of processing is performed with respect to the replaced wafers W. More specifically, the vacuum-side transfer device 31 receives one wafer W from the load-lock chamber 5a or 5b and loads the wafer W into the processing chamber 1a where the wafer W is processed. Next, the vacuum-side transfer device 31 receives one wafer W from the load-lock chamber 5a or 5b and loads the wafer W into the processing chamber 1c where the wafer W is processed. Subsequently, the vacuum-side transfer device 31 receives one wafer W from the load-lock chamber 5a or 5b and loads the wafer W into the processing chamber 1d where the wafer W is processed. In the present embodiment, the transfer operations of three wafers W, including the wafer W loaded into the first processing chamber 1a, the wafer W loaded into the second processing chamber 1c and the wafer W loaded into the last processing chamber 1d, are defined as one transfer cycle. The specified processing is performed with respect to a plurality of wafers W by repeating the transfer cycle a multiple number of times. In the second and subsequent transfer cycles, the vacuum-side transfer device 31 performs the pick-and-place transfer in which the processed wafer W is replaced by an unprocessed wafer W.

FIG. 6 illustrates one example of the sequence of the substrate transfer control method performed by the control unit 70 in the event that the loading prohibition state of the processing chamber (the processing chamber 1b in the aforementioned example) is terminated while the specified processing is performed in the first transfer order according to the sequence shown in FIG. 5.

In order to increase the operation efficiency of the substrate processing system 100, the termination of the loading prohibition state of the processing chamber 1b is immediately notified, as the management information of the processing chamber 1b, from the MC 73 controlling the processing chamber 1b to the EC 71 at the loading-prohibited-state termination time.

Referring to FIG. 6, in step S11, the EC 71 first acquires the management information indicating the termination of the loading prohibition state of the processing chamber 1b from the MC 73 of the processing chamber 1*b*. Next, in step S12, when a signal indicating the management information on the processing chamber 1*b* is received, the EC 71 determines whether there exists an "ongoing transfer cycle" in which the wafers W are transferred in the first transfer order (in the order of the processing chamber 1*a*, the processing chamber 1*c* and the processing chamber 1*d*). In this case, the "ongoing transfer cycle" starts at the start of the operation at which the wafer W to be loaded into the leading processing chamber 1*a* in the first transfer order (in the order of the processing chamber 1*a*, the processing chamber 1*c* and the processing chamber 1*d*) is unloaded from the load-lock chamber 5*a* or 5*b* during the latest Nth transfer cycle (where the N denotes a positive integer), ends at the end of the operation at which an unprocessed wafer W is loaded into the tail-end processing chamber 1*d* in the first transfer order and a processed wafer W, if any, is loaded into the load-lock chamber 5*a* or 5*b*. The "termination time of prohibition" of loading into the processing chamber 1*b* means the time point at which the EC 71 receives, in step S11, a signal indicating the management information on the processing chamber 1*b* as the management information is delivered from the MC 73 controlling the processing chamber 1*b* to the EC 71.

If it is determined in step S12 that there exists no ongoing transfer cycle (if No in step S12), the transfer order setting unit 123 of the EC 71 sets a second transfer order in step S13 so that, with respect to the processing chambers 1*a*, 1*b*, 1*c* and 1*d* including the loading-prohibition-state-terminated processing chamber 1*b*, the transfer order can be switched at the next transfer cycle of the ongoing transfer cycle. In the present embodiment, the second transfer order with respect to the processing chambers 1*a*, 1*b*, 1*c* and 1*d* including the loading-prohibition-state-terminated processing chamber 1*b* is set to include the first transfer order as it stands. In this case, the loading of the wafer W into the processing chamber 1*b* is added to the end of the first transfer order. In other words, the second transfer order is set such that the wafers W are loaded in the order of the processing chambers 1*a*, 1*c*, 1*d* and 1*b*. By setting the second transfer order to include the first transfer order as it stands, it becomes possible, even in the pick-and-place transfer, to keep the transfer rhythm of the vacuum-side transfer device 31 constant (namely, the pattern of the transfer operation repeatedly performed by the vacuum-side transfer device 31 during the respective transfer cycles and the time interval between the operation state and the stop state of the vacuum-side transfer device 31 characterized by the pattern of the transfer operation) before and after the termination of the loading prohibition state of the processing chamber 1*b*. In other words, if a new wafer W is immediately loaded into the loading-prohibition-state-terminated processing chamber 1*b*, it is necessary to perform an operation to unload the wafers W from the remaining processing chambers 1*a*, 1*c* and 1*d*. This may become a cause for destroying the transfer rhythm. However, if the second transfer order is set to include the first transfer order as it stands, it is unlikely that the transfer rhythm would be destroyed. This eliminates the possibility that the processing chambers 1*a*, 1*b*, 1*c* and 1*d* may stay empty after the transfer order is changed to the second transfer order or the possibility that the processed wafers W are left alone within the processing chambers 1*a*, 1*b*, 1*c* and 1*d* after the transfer order is changed to the second transfer order. Therefore, as compared with a case where the transfer control of the present embodiment is not performed, it is possible to significantly increase the throughput after restarting the use of the processing chamber 1*b*.

On the other hand, if it is determined in step S12 that there exists an ongoing transfer cycle (if Yes in step S12), the transfer order setting unit 123 of the EC 71 sets, in step S14, a second transfer order so that the transfer order can be switched at the ongoing transfer cycle. More specifically, the second transfer order is set such that the transfer of the wafer W into the processing chamber 1*b* is added to the end of the current transfer cycle.

Finally, in step S15, pursuant to the transfer order set in step S13 or S14, a control signal is sent from the transfer control unit 122 of the EC 71 to the MC 73 of the transfer chamber 3 including the vacuum-side transfer device 31, thereby instructing the vacuum-side transfer device 31 to perform the transfer of the wafers W in the second transfer order. Thus, the transfer of the wafers W is performed by the vacuum-side transfer device 31 in the second transfer order.

Referring to FIGS. 7A and 7B, description will be made on the operation of the substrate transfer control method according to the present embodiment. FIGS. 7A and 7B are tables illustrating a relationship between the transfer cycles and the management numbers of the wafers W, which are transferred to the respective processing chambers 1*a*, 1*b*, 1*c* and 1*d* in the first transfer order or the second transfer order. When the processing chamber 1*b* is kept in a loading prohibition state, the wafers W are loaded and processed in the first transfer order, namely in such an order that a first wafer W01 is loaded into the processing chamber 1*a*, a second wafer W02 into the processing chamber 1*c* and a third wafer W03 into the processing chamber 1*d*. It is assumed that, when the vacuum-side transfer device 31 is operated at the Nth transfer cycle and the nth wafer Wn is loaded into the processing chamber 1*a* (as indicated by a thick rectangular line in FIGS. 7A and 7B), the EC 71 receives a signal indicating the termination of the loading prohibition state of the processing chamber 1*b*. At this time point, the n+1$^{st}$ wafer Wn+1 is not loaded into the processing chamber 1*c* and the n+2$^{nd}$ wafer Wn+2 is not loaded into the processing chamber 1*d*. With a view to rapidly reinstate the processing chamber 1*b* and to increase the overall operation efficiency of the substrate processing system 100 even a little bit, the next n+1st wafer Wn+1 may be loaded into the loading-prohibition-state-terminated processing chamber 1*b* at the time when the loading of the nth wafer Wn into the processing chamber 1*a* is finished. By loading the next n+11st wafer Wn+1 into the processing chamber 1*b*, it may be possible to reinstate the normal transfer order (see step S5 in FIG. 5).

However, in case of performing such transfer control, an unprocessed wafer Wn+1 is loaded into the loading-prohibition-state-terminated processing chamber 1*b*. Therefore, even in the pick-and-place transfer, it becomes necessary to perform an operation to unload the wafers W from the remaining processing chambers 1*a*, 1*c* and 1*d*. This significantly changes the transfer order and destroys the transfer rhythm of the vacuum-side transfer device 31. As a result, during the time when the transfer is repeated in a new transfer order, the processing chambers 1*a*, 1*b*, 1*c* and 1*d* stay empty or the processed wafers W are left alone within the processing chambers 1*a*, 1*b*, 1*c* and 1*d*. This results in a decrease in the throughput of the substrate processing system 100.

In the present embodiment, while maintaining the first transfer order, the loading operation for the loading-prohibition-state-terminated processing chamber 1*b* is included in the time period during which the vacuum-side transfer device 31 waits for the end of the transfer cycle based on the first transfer order and the start of the next transfer cycle. In this case, specific methods of adding the loading operation for the processing chamber 1b without destroying the transfer rhythm include two methods, i) a method of switching a transfer order by correcting the ongoing Nth transfer cycle and ii) a method of switching a transfer order at the next N+1$^{st}$ transfer cycle.

i) Method of Switching a Transfer Order by Correcting the Ongoing Nth Transfer Cycle As indicated by double frames in FIG. 7A, a wafer Wn+3 is added after the last wafer Wn+2 included in the Nth transfer cycle. The wafer Wn+3 is loaded into the loading-prohibition-state-terminated processing chamber 1b. In this case, the Nth transfer cycle is changed from the transfer cycle based on the first transfer order to the transfer cycle based on the second transfer order. In the present embodiment, if it is determined in step S12 of FIG. 6 that there exists an ongoing transfer cycle (if Yes in step S12), the transfer order is switched, in step S14, to the second transfer order at the ongoing Nth transfer cycle. Thus, the ongoing Nth transfer cycle is replaced by the transfer cycle based on the second transfer order. In other words, the transfer order setting unit 123 of the EC 71 sets the second transfer order and the transfer control unit 122 redefines the Nth transfer cycle, issuing an instruction to switch the transfer order to the second transfer order.

ii) Method of Switching a Transfer Order at the Next N+1$^{st}$ Transfer Cycle

As indicated by double frames in FIG. 7B, a wafer Wn+6 is added after the last wafer included in the N+1$^{st}$ transfer cycle. The wafer Wn+6 is loaded into the loading-prohibition-state-terminated processing chamber 1b. In the present embodiment, if it is determined in step S12 of FIG. 6 that there exists no ongoing transfer cycle (if No in step S12), the transfer order is switched, in step S15, to the second transfer order from the N+1$^{st}$ transfer cycle. In other words, the transfer order setting unit 123 of the EC 71 sets the second transfer order and the transfer control unit 122 redefines the N+1$^{st}$ transfer cycle, issuing an instruction to switch the transfer order to the second transfer order. The switching from the first transfer order to the second transfer order may be delayed by two transfer cycles or more.

The transfer control shown in FIG. 6 is effective in a case where the time required in processing the wafers W within the processing chambers 1a, 1b, 1c and 1d is longer than the time required in transferring the wafers W to the respective processing chambers 1a, 1b, 1c and 1d. More specifically, the transfer control shown in FIG. 6 is particularly effective in a substrate processing process which satisfies the following equation (2):

$$T_r > T_{wpm} + T_{wllm} \quad (2),$$

where $T_r$ denotes the time required in processing the wafers W within the processing chambers 1a, 1b, 1c and 1d, $T_{wpm}$ denotes the time required in loading the wafers W from the vacuum-side transfer device 31 into the processing chambers 1a, 1b, 1c and 1d (the placing operation time), and $T_{wllm}$ denotes the time required for the vacuum-side transfer device 31 to receive the wafer W from the standby stage 6a or 6b (the picking operation time).

In order not to destroy the transfer rhythm of the vacuum-side transfer device 31, the switching from the first transfer order to the second transfer order may be uniformly delayed by one transfer cycle from the time point at which the EC 71 receives a signal indicating the termination of the loading prohibition state of the processing chamber 1b from the MC 73. In the present embodiment, however, the controls of the methods i) and ii) are selected in a case by case basis to maximize the throughput while uniformly maintaining the transfer rhythm before and after the switching of the transfer order. More specifically, in the present embodiment, if it is determined in step S12 of FIG. 6 that there exists an ongoing transfer cycle (if Yes in step S12), the Nth transfer cycle is changed and the n+3$^{rd}$ wafer Wn+3 as a tail-end wafer W is loaded into the loading-prohibition-state-terminated processing chamber 1b. Therefore, as compared with the control in which the switching from the first transfer order to the second transfer order is uniformly delayed by one transfer cycle, the use of the processing chamber 1b becomes faster by one transfer cycle. This makes it possible to increase the throughput.

As described above, in the present embodiment, the second transfer order includes the first transfer order as it stands. In other words, while maintaining the first transfer order, the loading operation for the loading-prohibition-state-terminated processing chamber 1b is included in the time period during which the vacuum-side transfer device 31 waits for the end of the transfer cycle based on the first transfer order and the start of the next transfer cycle. This eliminates the possibility that the processing chambers 1a, 1b, 1c and 1d stay empty after the transfer order is changed to the second transfer order or the possibility that the processed wafers W are left alone within the processing chambers 1a, 1b, 1c and 1d after the transfer order is changed to the second transfer order. It is therefore possible to uniformly maintain the transfer rhythm of the vacuum-side transfer device 31 before and after the termination of the loading prohibition state of the processing chamber 1b. Moreover, the existence of an ongoing transfer cycle is determined in step S12 and the switching timing to the second transfer order is decided pursuant to the determination result. Therefore, as compared with a case where the transfer control of the present embodiment is not performed, it is possible to significantly increase the throughput after restarting the use of the processing chamber 1b.

In the description made above, there has been illustrated an example in which one processing chamber 1b is terminated from the loading prohibition state. The same sequence as described above can be performed even when two or more processing chambers are kept in a loading prohibition state and are simultaneously or sequentially terminated from the loading prohibition state.

[Substrate Transfer Control Method according to a Second Embodiment]

Figure 8:
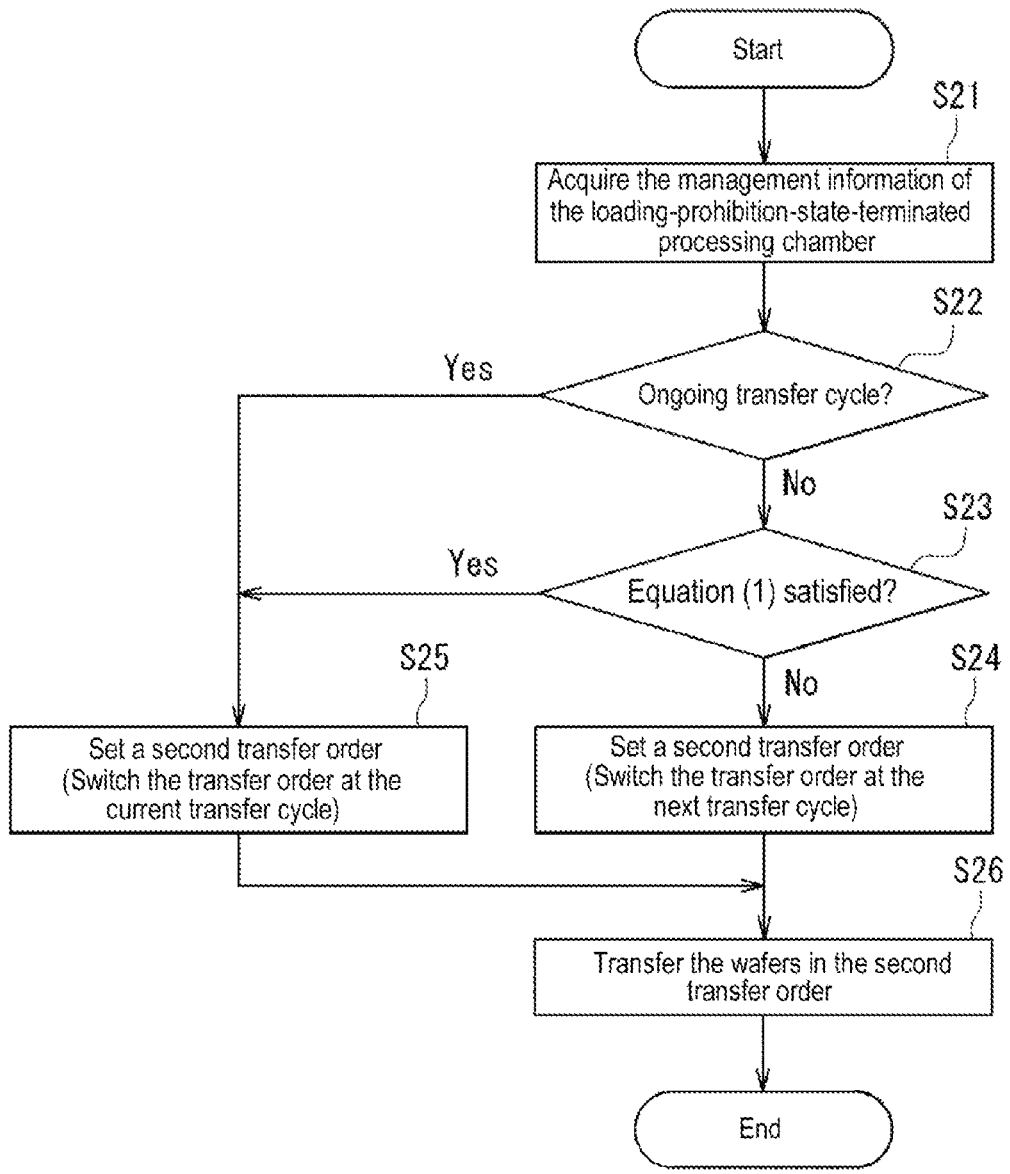
FIG. 8 is a flowchart illustrating the sequence of a substrate transfer control method according to a second embodiment of the present disclosure.

Referring to FIG. 8, description will be made on a substrate transfer control method according to a second embodiment of the present disclosure. FIG. 8 is a flowchart schematically explaining the sequence of a substrate transfer control method according to the present embodiment. In the present embodiment, the same kind of processing (e.g., film forming) is parallel-performed in the processing chambers 1a, 1b, 1c and 1d of the substrate processing system 100. In the present embodiment, the transfer of the wafers W is performed in the first transfer order (see FIG. 5). The present embodiment is directed to a control method used in a case where the loading prohibition state of the processing chamber 1b is terminated when the wafers W are transferred based on the first transfer order.

The substrate transfer control method according to the present embodiment may include the sequence of steps S21 to S26 shown in FIG. 8. Among these steps, steps S21, S22 and S24 to S26 are respectively identical to steps S11, S12 and S13 to S15 of the substrate transfer control method according to the first embodiment. Therefore, duplicate description will be omitted.

Referring to FIG. 8, in step S21, the EC 71 first acquires the management information indicating the termination of the loading prohibition state of the processing chamber 1b from the MC 73 of the processing chamber 1b. Next, in step S22, when a signal indicating the management information is receives, the EC 71 determines whether there exists an ongoing transfer cycle in which the wafers W are transferred in the first transfer order (in the order of the processing chamber 1a, the processing chamber 1c and the processing chamber 1d).

If it is determined in step S22 that there exists no ongoing transfer cycle (if No in step S22), the EC 71 determines in step S23 whether the following equation (1) is satisfied:

$$T_{rmin} \geq T_{wpm} + T_{wllm} \qquad (1),$$

where $T_{rmin}$ denotes the minimum value of the remaining process time in the processing chambers to which the wafers W are transferred in the first transfer order (the processing chambers 1a, 1c and 1d in the present embodiment), $T_{wpm}$ denotes the time required in loading the wafers W from the vacuum-side transfer device 31 into the processing chamber 1b, and $T_{wllm}$ denotes the time required for the vacuum-side transfer device 31 to receive the wafer W from the standby stage 6a or 6b.

In the equation (1), $T_{wpm} + T_{wllm}$ means the total time required for the vacuum-side transfer device 31 to receive an unprocessed wafer W from the standby stage 6a or 6b and to load the wafer W into the loading-prohibition-state-terminated processing chamber 1b. Accordingly, when the equation (1) is satisfied, even if an unprocessed wafer W is loaded from the standby stage 6a or 6b into the loading-prohibition-state-terminated processing chamber 1b at the time point of the determination of step S23, the replacement operation of the wafers W performed is not affected when the processes are finished within the remaining processing chambers 1a, 1c and 1d. In other words, if the equation (1) is satisfied, it is possible to load the wafer W into the loading-prohibition-state-terminated processing chamber 1b without destroying the transfer rhythm of the wafers W transferred to the processing chambers 1a, 1c and 1d in the first transfer order. On the contrary, if it is determined in step S23 that the equation (1) is not satisfied (if No in step S23), it is likely that the transfer rhythm is destroyed.

Therefore, if it is determined in step S23 that the equation (1) is not satisfied (if No in step S23), the transfer order setting unit 123 of the EC 71 sets a second transfer order in step S24 so that the transfer order can be switched at the next transfer cycle of the ongoing transfer cycle. In the present embodiment, the second transfer order with respect to the processing chambers 1a, 1b, 1c and 1d including the loading-prohibition-state-terminated processing chamber 1b is set to include the first transfer order as it stands. In this case, the loading of the wafer W into the processing chamber 1b is added to the end of the first transfer order. In other words, according to the second transfer order, the wafers W are loaded in the order of the processing chambers 1a, 1c, 1d and 1b.

On the other hand, if it is determined in step S22 that there exists an ongoing transfer cycle (if Yes in step S22) or if it is determined in step S23 that the equation (1) is satisfied (if Yes in step S23), the transfer order setting unit 123 of the EC 71 sets a second transfer order in step S25 so that the transfer order can be switched at the ongoing transfer cycle. In this case, the current transfer cycle is changed and the loading of the wafer W into the processing chamber 1b is added to the end of the current transfer cycle.

Finally, in step S26, pursuant to the transfer order set in step S24 or S25, a control signal is sent from the transfer control unit 122 of the EC 71 to the MC 73 of the transfer chamber 3 including the vacuum-side transfer device 31, thereby instructing the vacuum-side transfer device 31 to perform the transfer of the wafers W in the second transfer order. Thus, the transfer of the wafers W is performed by the vacuum-side transfer device 31 in the second transfer order.

In the present embodiment, the second transfer order includes the first transfer order as it stands. In other words, while maintaining the first transfer order, the loading operation for the loading-prohibition-state-terminated processing chamber 1b is included in the time period during which the vacuum-side transfer device 31 waits for the end of the transfer cycle based on the first transfer order and the start of the next transfer cycle. This eliminates the possibility that the processing chambers 1a, 1b, 1c and 1d stay empty after the transfer order is changed to the second transfer order or the possibility that the processed wafers W are left alone within the processing chambers 1a, 1b, 1c and 1d after the transfer order is changed to the second transfer order. It is therefore possible to uniformly maintain the transfer rhythm of the vacuum-side transfer device 31 before and after the termination of the loading prohibition state of the processing chamber 1b. Moreover, the existence of an ongoing transfer cycle is determined in step S22 and the satisfaction of the equation (1) is determined in step S23. The switching timing to the second transfer order is decided pursuant to the determination results. Therefore, as compared with a case where the transfer control of the present embodiment is not performed, it is possible to significantly increase the throughput after restarting the use of the processing chamber 1b. The substrate transfer control method according to the present embodiment is particularly effective in a process which satisfies the equation (2). Other configurations, operations and effects of the present embodiment remain the same as those of the first embodiment.

[Modified Example of the Second Embodiment]

Figure 9:
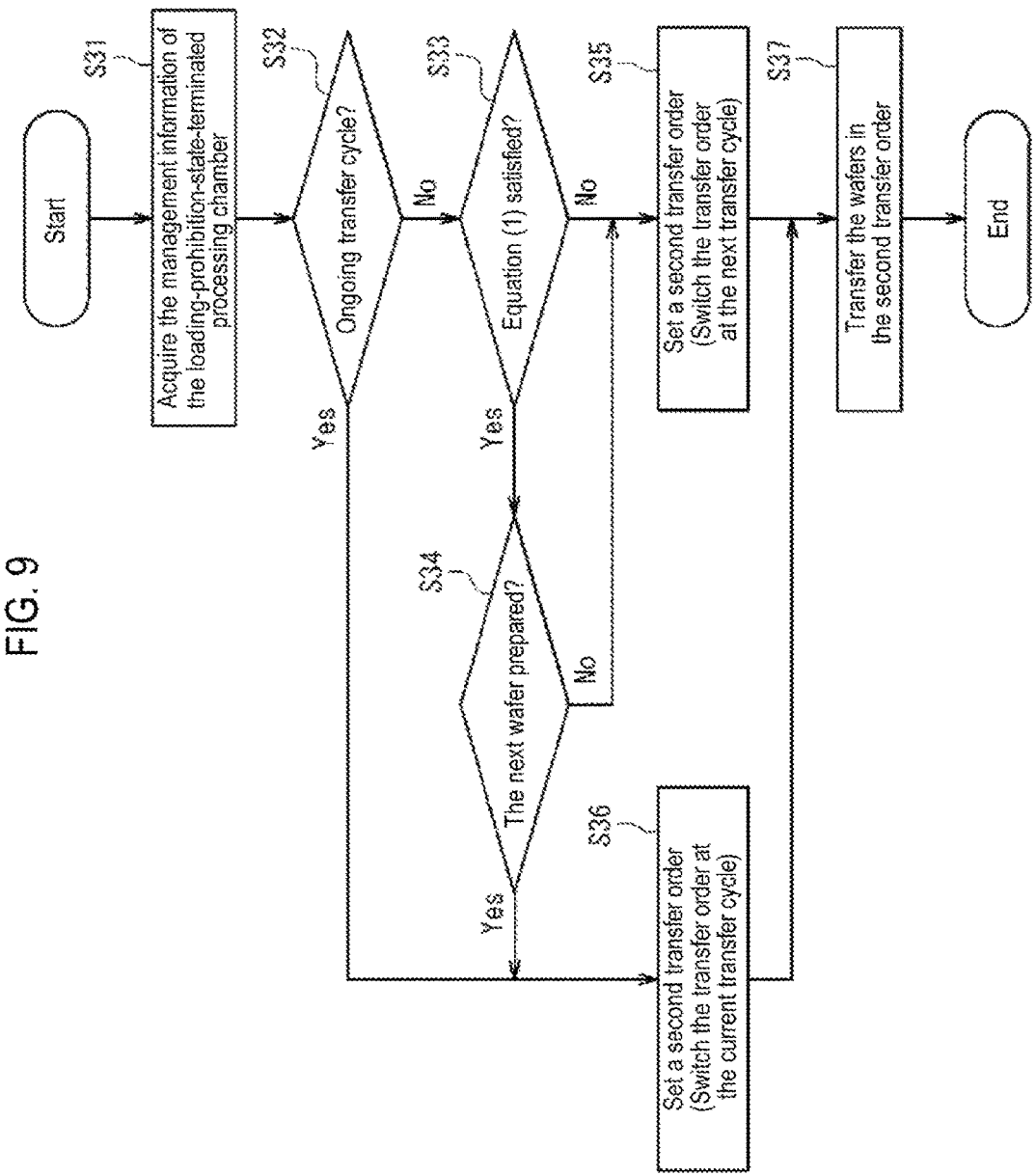
FIG. 9 is a flowchart illustrating the sequence of a substrate transfer control method according to one modified example of the second embodiment of the present disclosure.

Referring to FIG. 9, description will be made on a modified example of the substrate transfer control method according to the second embodiment. FIG. 9 is a flowchart schematically explaining the sequence of the substrate transfer control method according to the present modified example. In the present modified example, the same kind of processing (e.g., film forming) is parallel-performed in the processing chambers 1a, 1b, 1c and 1d of the substrate processing system 100. In the present embodiment, the transfer of the wafers W is performed in the first transfer order (see FIG. 5). The present embodiment is directed to a control method used in a case where the loading prohibition state of the processing chamber 1b is terminated when the wafers W are transferred based on the first transfer order.

The substrate transfer control method according to the present modified example may include the sequence of steps S31 to S37 shown in FIG. 9. Among these steps, steps S31 to S33 and steps S35 to S37 are respectively identical with steps S21 to S23 and steps S24 to S26 of the substrate transfer control method according to the second embodiment. Therefore, duplicate description will be omitted.

Referring to FIG. 9, in step S31, the EC 71 first acquires the management information indicating the termination of the loading prohibition state of the processing chamber 1b from the MC 73 of the processing chamber 1b. Next, in step S32, when a signal indicating the management information is received, the EC 71 determines whether there exists an ongoing transfer cycle in which the wafers W are transferred in the first transfer order (in the order of the processing chamber 1a, the processing chamber 1c and the processing chamber 1d).

If it is determined in step S32 that there exists no ongoing transfer cycle (if No in step S32), the EC 71 determines in step S33 whether the equation (1) is satisfied.

If it is determined in step S33 that the equation (1) is satisfied (if Yes in step S33), in step S34, the EC 71 determines whether the next unprocessed wafer W is prepared in the standby stage 6a or 6b based on the status information acquired from the MC 73 of the load-lock chamber 5a or 5b. Since the determination of step S33 is solely based on the time, there is a possibility that, at the time point at which it is determined in step S33 that the equation (1) is satisfied (Yes), the next wafer W is not prepared in the standby stage 6a or 6b. For that reason, in the present modified example, the determination of step S34 is performed.

If it is determined in step S33 that the equation (1) is not satisfied (if No in step S33) and if it is determined in step S34 that the next wafer W is not prepared (if No in step S34), the transfer order setting unit 123 of the EC 71 sets a second transfer order in step S35 so that the transfer order can be switched at the next transfer cycle of the ongoing transfer cycle. In the present modified example, the second transfer order with respect to the processing chambers 1a, 1b, 1c and 1d including the loading-prohibition-state-terminated processing chamber 1b is set to include the first transfer order as it stands. In this case, the loading of the wafer W into the processing chamber 1b is added to the end of the first transfer order. In other words, according to the second transfer order, the wafers W are loaded in the order of the processing chambers 1a, 1c, 1d and 1b.

On the other hand, if it is determined in step S32 that there exists an ongoing transfer cycle (if Yes in step S32) or if it is determined in step S34 that the next wafer W is prepared (if Yes in step S34), the transfer order setting unit 123 of the EC 71 sets a second transfer order in step S36 so that the transfer order can be switched at the ongoing transfer cycle. In this case, the current transfer cycle is changed and the loading of the wafer W into the processing chamber 1b is added to the end of the current transfer cycle.

Finally, in step S37, pursuant to the transfer order decided in step S35 or S36, a control signal is sent from the EC 71 to the MC 73 of the transfer chamber 3 including the vacuum-side transfer device 31, thereby instructing the vacuum-side transfer device 31 to perform the transfer of the wafers W in the second transfer order. Thus, the transfer of the wafers W is performed by the vacuum-side transfer device 31 in the second transfer order.

In the present modified example, the reason for switching the transfer order at the next transfer cycle in step S35 if it is determined in step S34 that the next wafer W is not prepared (if No in step S34) is to provide a sufficient time to prepare the next wafer W in the standby stage 6a or 6b if the time is lapsed until the next transfer cycle. The transfer operation of the atmosphere-side transfer device 51 is controlled by the transfer control unit 122 of the EC 71 so that the wafer W can be supplemented to the standby stage 6a or 6b at the timing at which the transfer cycle based on the first transfer order is performed by the vacuum-side transfer device 31 in a timely manner. Therefore, if the transfer of the wafer W into the processing chamber 1c is added, in step S35, to the end of the next transfer cycle (the transfer cycle changed pursuant to the second transfer order), the wafer W prepared in the standby stage 6a or 6b for use in the pre-change transfer cycle can be transferred to the processing chamber 1b in the post-change transfer cycle.

Other configurations, operations and effects of the present modified example remain the same as those of the second embodiment.

In the respective embodiments described above, the second transfer order includes the first transfer order as it stands. It is therefore possible to keep the transfer rhythm of the vacuum-side transfer device 31 constant. This eliminates the possibility that the processing chambers 1a, 1b, 1c and 1d stay empty after the transfer order is changed to the second transfer order or the possibility that the processed wafers W are left alone within the processing chambers 1a, 1b, 1c and 1d after the transfer order is changed to the second transfer order. Accordingly, it is possible to significantly increase the throughput in the substrate processing system 100. Further, since the processing chambers 1a, 1b, 1c and 1d do not stay empty, it is possible to keep constant the processing content and the product quality, thereby increasing the reliability of the product quality.

While certain embodiments of the present disclosure have been described in detail for the sake of illustration, the present disclosure is not limited to the aforementioned embodiments but may be modified in many different forms.

For example, in the aforementioned embodiments, the substrate processing system 100 provided with four processing chambers 1a, 1b, 1c and 1d adjoining the vacuum-side transfer chamber 3 has been described by way of example. However, the present disclosure can be applied to a substrate processing system provided with a cluster tool having other configuration, as long as the substrate processing system includes three or more processing chambers. It goes without saying that the present disclosure can be applied to a processing system for performing a transfer operation in the atmosphere.

FIG. 10A illustrates a substrate processing system 200 including a cluster tool provided with six processing chambers, to which the present disclosure is applicable. The substrate processing system 200 includes processing chambers 201a, 201b, 201c, 201d, 201e and 201f which are arranged around a transfer chamber 203. Load-lock chambers 205a and 205b, each of which has a delivery unit (not shown), are installed adjacent to the transfer chamber 203. Within the transfer chamber 203, there is installed a transfer device 207 capable of gaining access to the processing chambers 201a to 201f and the load-lock chambers 205a and 205b. In the substrate processing system 200, even if one or more of the processing chambers are kept in a loading prohibition state and even if the loading prohibition state of one or more of the processing chambers is terminated, a second transfer order including a first transfer order as it stands can be set with respect to all the processing chambers to which wafers W can be loaded, including one or more processing chambers whose loading prohibition state is terminated.

Figure 10B:
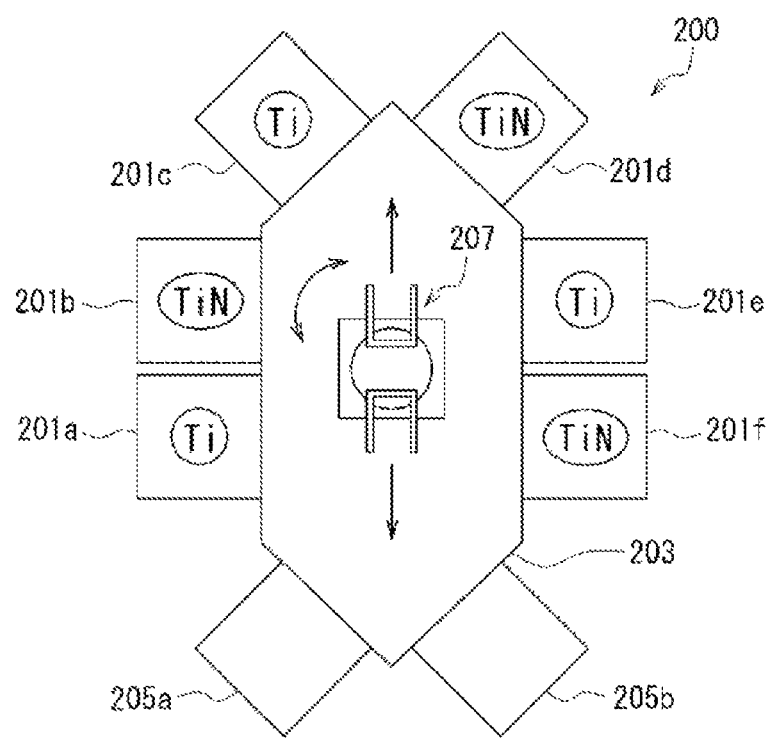
FIG. 10B is an explanatory view of an application example of the present disclosure.

Moreover, the present disclosure can be applied to a substrate processing system for performing a serial transfer and an OR transfer in combination. FIG. 10B shows a configuration example used in case where a Ti film is formed and then a TiN film is formed by the substrate processing system 200 shown in FIG. 10A. In this case, the processing chambers 201a to 201f are allotted so that the Ti film can be formed in the processing chambers 201a, 201c and 201e while the TiN film can be formed in the processing chambers 201b, 201d and 201f.

In case of the configuration illustrated in FIG. 10B, the group of the processing chambers 201a, 201c and 201e for forming the Ti film (referred to as "group A" for the sake of convenience in description) and the group of the processing chambers 201b, 201d and 201f for forming the TiN film (referred to as "group B" for the sake of convenience in description) are in a serial transfer relationship with each other. On the other hand, the three processing chambers 201a, 201c and 201e belonging to the group A are in an OR transfer relationship with one another. Likewise, the three processing chambers 201b, 201d and 201f belonging to the group B are in an OR transfer relationship with one another. Accordingly, similar to the aforementioned embodiments, the present disclosure can be applied to the transfer control for the three processing chambers of the group A and the transfer control for the three processing chambers of the group B. In other words, even if the loading prohibition state of one of the processing chambers of the group A or the group B is terminated, a second transfer order including a first transfer order as it stands can be set with respect to the processing chambers of the same group into which wafers W can be loaded, including the loading-prohibition-state-terminated processing chamber.

For example, the processing chambers 201a, 201b, 201c, 201d, 201e and 201f can be divided into the group of the processing chambers [201a and 201b] (referred to as "group X" for the sake of convenience in description), the group of the processing chambers [201c and 201d] (referred to as "group Y" for the sake of convenience in description), and the group of the processing chambers [201e and 201f] (referred to as "group Z" for the sake of convenience in description). A serial transfer is performed in each of the groups X, Y and Z. For example, in the group X, a serial transfer is performed from the processing chamber 201a to the processing chamber 201b. This holds true in the remaining groups Y and Z. In this case, if one of the processing chambers in each of the groups X, Y and Z is in a loading prohibition state, the wafers W are not loaded into the remaining processing chambers. On the other hand, an OR transfer is performed between the groups X, Y and Z. Even in this configuration example, similar to the aforementioned embodiments, the present disclosure can be applied the control of the transfer between the groups X, Y and Z remaining in an OR transfer relationship. In other words, the groups X, Y and Z are in a parallel selection relationship with one another. Therefore, even if the loading prohibition state of one of the processing chambers of the group X, the group Y or the group Z is terminated, a second transfer order including a first transfer order as it stands can be set in between the groups X, Y and Z.

The present disclosure can also be applied to a substrate processing system for processing, e.g., a large-size glass substrate and a ceramics substrate used in a liquid crystal display or an organic EL display.

According to the present disclosure, the second transfer order includes the first transfer order as it stands. It is therefore possible to keep constant the transfer rhythm of the transfer device. This eliminates the possibility that the processing chambers stay empty after the transfer order is changed to the second transfer order or the possibility that the processed substrates are left alone within the processing chambers after the transfer order is changed to the second transfer order. Accordingly, it is possible to significantly increase the throughput in the substrate processing system. Further, since the processing chambers do not stay empty, it is possible to keep constant the processing content and the product quality, thereby increasing the reliability of the product quality.

While certain embodiments have been described, these embodiments have been presented by way of example only, and are not intended to limit the scope of the disclosures. Indeed, the novel systems and methods described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing system, comprising:
a plurality of processing chambers configured to perform a predetermined processing with respect to substrates;
a transfer device configured to transfer the substrates to the processing chambers in a predetermined order; and
a delivery unit configured to deliver the substrates between the delivery unit and the transfer device, the substrate processing system configured to sequentially process the substrates by repeating an operation in which the substrates are transferred by the transfer device from the delivery unit to the processing chambers in a predetermined transfer order, the substrate processing system further comprising:
a transfer order setting unit configured to, when one or more of the processing chambers stays in a substrate loading prohibition state, set a first transfer order with respect to the remaining processing chambers into which the substrates are loadable, and configured to, if the loading prohibition state of one or more of the processing chambers is terminated and brought into a substrate loadable state, set a second transfer order including the first transfer order as it stands, with respect to all the processing chambers into which the substrates are loadable, including the processing chambers whose loading prohibition state is terminated, the second transfer order being set by adding the loading of the substrates into the processing chambers whose loading prohibition state is terminated to an end of the first transfer order; and
a transfer control unit configured to switch the first transfer order to the second transfer order,
wherein, when one transfer cycle ranges from the loading of a substrate into a first processing chamber to the loading of a substrate into a last processing chamber in the first transfer order and the second transfer order,
the transfer control unit is configured to switch the first transfer order to the second transfer order at a predetermined transfer cycle, if the predetermined transfer cycle based on the first transfer order is ongoing at the time point at which the loading prohibition state of one or more of the processing chambers is terminated, and
the transfer control unit is configured to switch the first transfer order to the second transfer order at a subsequent transfer cycle, if the predetermined transfer cycle is finished.

2. A substrate processing system, comprising:
a plurality of processing chambers configured to perform a predetermined processing with respect to substrates;
a transfer device configured to transfer the substrates to the processing chambers in a predetermined order; and
a delivery unit configured to deliver the substrates between the delivery unit and the transfer device, the substrate processing system configured to sequentially process the substrates by repeating an operation in which the substrates are transferred by the transfer device from the delivery unit to the processing chambers in a predetermined transfer order, the substrate processing system further comprising:
- a transfer order setting unit configured to, when one or more of the processing chambers stays in a substrate loading prohibition state, set a first transfer order with respect to the remaining processing chambers into which the substrates are loadable, and configured to, if the loading prohibition state of one or more of the processing chambers is terminated and brought into a substrate loadable state, set a second transfer order including the first transfer order as it stands, with respect to all the processing chambers into which the substrates are loadable, including the processing chambers whose loading prohibition state is terminated; and
- a transfer control unit configured to switch the first transfer order to the second transfer order,
- wherein, when one transfer cycle ranges from the loading of a substrate into a first processing chamber to the loading of a substrate into a last processing chamber in the first transfer order and the second transfer order,
- the transfer control unit is configured to switch the first transfer order to the second transfer order at a predetermined transfer cycle, if the predetermined transfer cycle based on the first transfer order is ongoing at the time point at which the loading prohibition state of one or more of the processing chambers is terminated,
- the transfer control unit is configured to switch the first transfer order to the second transfer order at the predetermined transfer cycle, if the predetermined transfer cycle is finished and if equation (1), $T_{rmin} \geq T_{wpm} + T_{wllm}$, is satisfied,
- $T_{rmin}$ denotes the minimum value of a remaining process time in the processing chambers to which the substrates are transferred in the first transfer order, $T_{wpm}$ denotes the time required in loading the substrates from the transfer device into the processing chambers, and $T_{wllm}$ denotes the time required for the transfer device to receive the substrates from the delivery unit, and
- the transfer control unit is configured to switch the first transfer order to the second transfer order at a subsequent transfer cycle, if the predetermined transfer cycle is finished and if the equation (1) is not satisfied.

3. The system of claim 1, wherein
the transfer control unit is configured to switch the first transfer order to the second transfer order at the predetermined transfer cycle, if the predetermined transfer cycle is finished, if equation (1) , $T_{rmin} \geq T_{wpm} + T_{wllm}$, is satisfied and if an unprocessed substrate is prepared in the delivery unit,
$T_{rmin}$ denotes the minimum value of a remaining process time in the processing chambers to which the substrates are transferred in the first transfer order, $T_{wpm}$ denotes the time required in loading the substrates from the transfer device into the processing chambers, and Twllm denotes the time required for the transfer device to receive the substrates from the delivery unit, and
the transfer control unit is configured to switch the first transfer order to the second transfer order at the subsequent transfer cycle, if the equation (1) is satisfied and if the unprocessed substrate is not prepared in the delivery unit.

4. A substrate transfer control method for use in a substrate processing system including a plurality of processing chambers configured to perform a predetermined processing with respect to substrates, a transfer device configured to transfer the substrates to the processing chambers in a predetermined order, and a delivery unit configured to deliver the substrates between the delivery unit and the transfer device, the substrate processing system configured to sequentially process the substrates by repeating an operation in which the substrates are transferred by the transfer device from the delivery unit to the processing chambers in a predetermined transfer order, the method comprising:
- when one or more of the processing chambers stays in a substrate loading prohibition state, setting a first transfer order with respect to the remaining processing chambers into which the substrates are loadable; and
- if the loading prohibition state of one or more of the processing chambers is terminated and are brought into a substrate loadable state, setting a second transfer order with respect to all the processing chambers into which the substrates are loadable, including the processing chambers whose loading prohibition state is terminated, the second transfer order being set by adding the loading of the substrates into the processing chambers whose loading prohibition state is terminated to an end of the first transfer order,
- wherein the second transfer order includes the first transfer order as it stands,
- wherein, when one transfer cycle ranges from the loading of a substrate into a first processing chamber to the loading of a substrate into a last processing chamber in the first transfer order and the second transfer order,
- if a predetermined transfer cycle based on the first transfer order is ongoing at the time point at which the loading prohibition state of one or more of the processing chambers is terminated, the first transfer order is switched to the second transfer order at the predetermined transfer cycle, and
- if the predetermined transfer cycle is finished, the first transfer order is switched to the second transfer order at a subsequent transfer cycle.

5. The method of claim 4, wherein
if the predetermined transfer cycle is finished and if equation (1) , $T_{rmin} \geq T_{wpm} + T_{wllm}$, is satisfied, the first transfer order is switched to the second transfer order at the predetermined transfer cycle,
$T_{rmin}$ denotes the minimum value of a remaining process time in the processing chambers to which the substrates are transferred in the first transfer order, $T_{wpm}$ denotes the time required in loading the substrates from the transfer device into the processing chambers, and $T_{wllm}$ denotes the time required for the transfer device to receive the substrates from the delivery unit, and
if the equation (1) is not satisfied, the first transfer order is switched to the second transfer order at the subsequent transfer cycle.

6. The method of claim 4, wherein,
if the predetermined transfer cycle is finished , if equation (1) , $T_{rmin} \geq T_{wpm} + T_{wllm}$, is satisfied and if an unprocessed substrate is prepared in the delivery unit, the first transfer order is switched to the second transfer order at the predetermined transfer cycle,
$T_{rmin}$ denotes the minimum value of a remaining process time in the processing chambers to which the substrates are transferred in the first transfer order, $T_{wpm}$ denotes the time required in loading the substrates from the transfer device into the processing chambers, and $T_{wllm}$ denotes the time required for the transfer device to receive the substrates from the delivery unit, and
if the equation (1) is satisfied and if the unprocessed substrate is not prepared in the delivery unit, the first transfer order is switched to the second transfer order at the subsequent transfer cycle.

* * * * *